(12) United States Patent
Gustafsson et al.

(10) Patent No.: US 6,370,186 B1
(45) Date of Patent: Apr. 9, 2002

(54) SIGNAL PROCESSING

(75) Inventors: Kjell Gustafsson; Roozbeth Atarius, both of Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/195,990

(22) Filed: Nov. 20, 1998

(30) Foreign Application Priority Data

Nov. 21, 1997 (GB) .............................. 9724696

(51) Int. Cl.⁷ .......................... H03M 1/00; H04L 25/10
(52) U.S. Cl. ...................... 375/216; 341/122; 341/123; 341/143; 341/155
(58) Field of Search .................. 375/216, 253, 375/242; 455/76; 341/123, 155, 143, 122

(56) References Cited

U.S. PATENT DOCUMENTS

| 5,610,559 A | 3/1997 | Dent |
| 5,619,202 A | 4/1997 | Wilson et al. |
| 5,708,432 A * | 1/1998 | Reynolds et al. ............ 341/123 |
| 6,147,632 A * | 11/2000 | Iwasaki ....................... 341/123 |

FOREIGN PATENT DOCUMENTS

| DE | 3521288 A1 | 12/1986 |
| EP | 0 019 412 | 11/1980 |
| WO | WO 96/16482 | 5/1996 |

OTHER PUBLICATIONS

Johnson, M.J.: *A Simple Technique for Fractional Digital Division*, Motorola Technical Developments, vol. 112, Oct., 1990, pgs. 3–4.

* cited by examiner

*Primary Examiner*—Chi Pham
*Assistant Examiner*—Dung X. Nguyen
(74) *Attorney, Agent, or Firm*—Burns, Doane, Swecker & Mathis, L.L.P.

(57) ABSTRACT

A circuit is disclosed for sampling analog signals at a rate which is a rational, non-integer fraction of a clock frequency. The analog signal is sampled at non-equidistant sampling points, with the distances between successive points forming a jitter sequence. The jitter sequence is pre-calculated and stored in a memory within the circuit, reducing processing requirements in use.

17 Claims, 2 Drawing Sheets

SIGNAL PROCESSING

TECHNICAL FIELD OF THE INVENTION

This invention relates to a method and a device for signal processing, and in particular to the sampling of analog signals.

DESCRIPTION OF RELATED ART

When sampling an analog signal, for example when converting an analog speech signal to a digital signal, it is convenient to be able to select the frequency of a master clock which controls the sampler to be an integer multiple of the sample rate of the digital signal. However, in the case of, for example, a dual mode cellular phone, which needs to be able to sample analog signals in order to achieve two distinct symbol rates for use in the two modes, it is also advantageous to be able to provide only one master clock frequency generator. If so, it is usually the case that, if one of the sampling rates is an integer fraction of the master clock frequency, then the other is not an integer fraction.

WO96/16482 describes an analog-to-digital converter in which an analog signal is sampled at a rate which is a non-integer fraction of the master clock frequency. Specifically, the analog-to-digital converter includes a sigma-delta modulator for varying the temporal spacing between digital samples. In particular, the delta-sigma modulator is used to generate a jitter sequence, in accordance with which the gap between adjacent digital samples is controlled between two chosen values. The average gap between adjacent samples is the inverse of the sampling rate which is achieved, and the delta-sigma modulator is used to generate a jitter sequence in which the sampling noise, namely the difference between this output sampling and true sampling at the desired sample rate, is hopefully minimised.

However, the requirement to incorporate a delta-sigma modulator in the device adds complication thereto, and increases the power consumption thereof, while fixing the jitter sequence to that generated by the delta-sigma modulator.

SUMMARY OF THE INVENTION

In accordance with the invention, the jitter sequence, in accordance with which the analog signal is sampled, is calculated off-line, and stored in a memory within the device.

This has the advantage that the device itself is simpler and has a lower power consumption.

Preferably, the memory is reprogrammable. This has the advantage that the jitter sequence can be replaced at any time if an improved sequence is devised.

In accordance with one preferred aspect of the invention, there is provided a sampling circuit, including a memory for storing a sequence of values, the gap between adjacent samples being controlled by the sequence.

In accordance with a second aspect of the invention, there is provided a method of sampling a signal, the method comprising sampling the signal at a plurality of points in time, each point being separated from the next by an integer number of cycles at the clock frequency, and the number of cycles separating successive samples forming a sequence, the sequence being pre-calculated and stored.

In accordance with a further aspect of the invention, there is provided a dual mode telephone in which, in one mode, the incoming signal is sampled at a non-integer fraction of a clock frequency, using a jitter sequence to control the sampling.

DETAILED DESCRIPTION OF PREFERRED EMBODIMENTS

Figure 1:
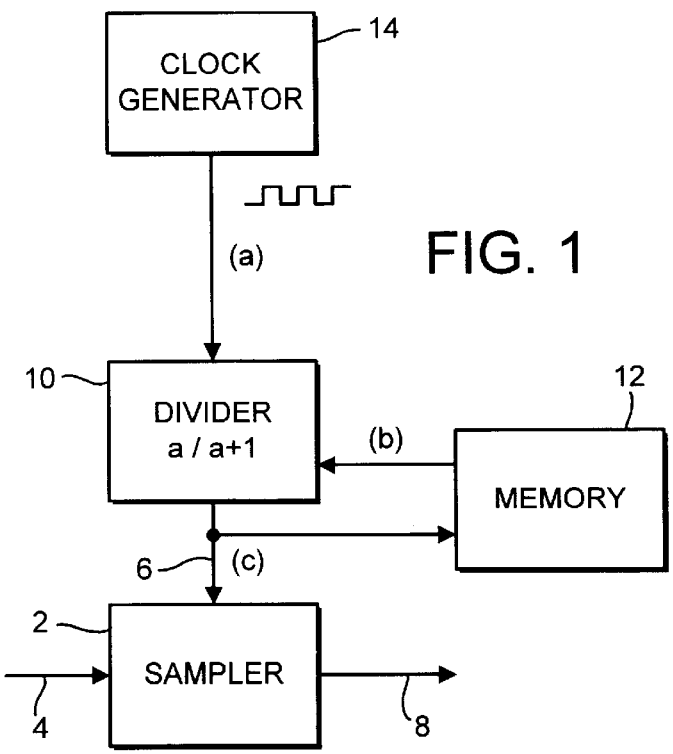
FIG. 1 is a block schematic diagram of a sampling circuit in accordance with the invention.

The device of FIG. 1 includes a sampler 2, which receives an input analog signal at its signal input 4 and receives a control signal on its control input 6. The sampled value of the input analog signal is supplied on the output 8 of the sampler 2.

The control signal received by the sampler 2 is supplied by a divider 10 under the control of signals supplied from a memory 12, and derived from a master clock signal supplied from a clock generator 14. The clock generator 14 supplies a master clock signal at a predetermined frequency which may, for example, be used elsewhere in the device. The divider 10 is able to divide the frequency of the master clock signal by a selected one of a plurality of integers. For example, in the preferred embodiment, these are two consecutive integers a and a+1, which will be chosen to be respectively less than and greater than the desired average division ratio, and the input received from the memory 12 at any time determines whether the divider next provides an output pulse after a master clock signal pulses, or after a+1 such pulses.

The memory 12 contains a precalculated sequence of zeros and ones which are supplied to the divider 10, to control its division ratio.

Figure 2:
FIG. 2 is a timing diagram showing signals generated in accordance with the invention.
Figure 2:
Figure 2:
Figure 2:
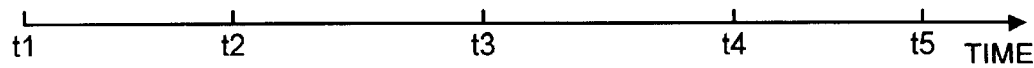

FIG. 2 is a timing diagram showing the signals at different points in the circuit of FIG. 1. In FIG. 2, line (a) shows the master clock signal supplied by the clock generator 14 to the divider 10. Line (b) shows the sequence of zeros and ones supplied by the memory 12 to the divider 10. Line (c) shows the sequence of secondary clock pulses supplied by the divider 10 to the sampler 6 as control signals. This is a particularly simple example, which is purely for illustrative purposes. In this example, it is desired to produce digital samples at a rate which is lower than the frequency of the master clock signal by a factor of 5⅔. For example, if the master clock frequency is at 17 MHz, the sampling rate will be 3 MHz.

Thus, the clock generator 14 produces an output pulse train as shown in line (a), in a way which will be well known to those skilled in the art.

Because the required sample rate is 1/5⅔ of the master clock frequency, the divider 10 is chosen to be able to divide the master clock frequency by either 5 or 6, that is, the adjacent integers respectively less than and greater than the required dividing factor.

Thus, as can be seen in line (c), the divider produces an output pulse following the receipt of either 5 or 6 input clock pulses. Thus, at time t1, an output pulse is produced by the divider 10, as shown in line (c). This pulse is supplied to the sampler 2, which takes a sample of the analog signal. Moreover, the pulse from the divider 10 is also supplied to the memory 12. Memory 12 stores a preprogrammed sequence of ones and zeros, which are used to control the divider 10. In this case, when the memory 10 supplies a "one" to the divider 10, the divider produces an output clock signal following receipt of 5 input pulses. When the memory 12 supplies a "zero" to the divider 10, the divider supplies an output pulse signal following receipt of 6 input clock pulses. In this simple example, the stored sequence is 1 0 0 1 0 0 1 0 0 . . . However, it will be appreciated that any recurring sequence which contains twice as many zeros as ones will produce an output pulse sequence which produces a dividing factor of 5⅔. Different sequences will produce different noise components, and the person skilled in the art can select an appropriate sequence to minimise the noise, or at least the noise component at frequencies of interest, while storing the shortest sequence possible for ease of implementation.

Thus, returning to FIG. 2, at time t2, following receipt of 5 master clock pulses, the divider produces a further secondary clock pulse, which causes a zero to be output from memory 12. Further, at time t3, following receipt of 6 master clock pulses, the next secondary clock pulse is generated, which causes the next value to be output from the memory 12. In this case, the next such value is again a zero. Following receipt of a further 6 master clock pulses at time t4, the divider outputs a further secondary clock pulse, which again causes the next value to be output from the memory 12. On this occasion, that next value is a 1, and so, at time t5, after the receipt of a further 5 master clock pulses, the divider outputs the next secondary clock pulse.

Thus, as shown in FIG. 2(c), the sampling points are non-equidistant, and the distances between successive points form a jitter sequence, which has been pre-calculated to give the desired properties.

Figure 3:
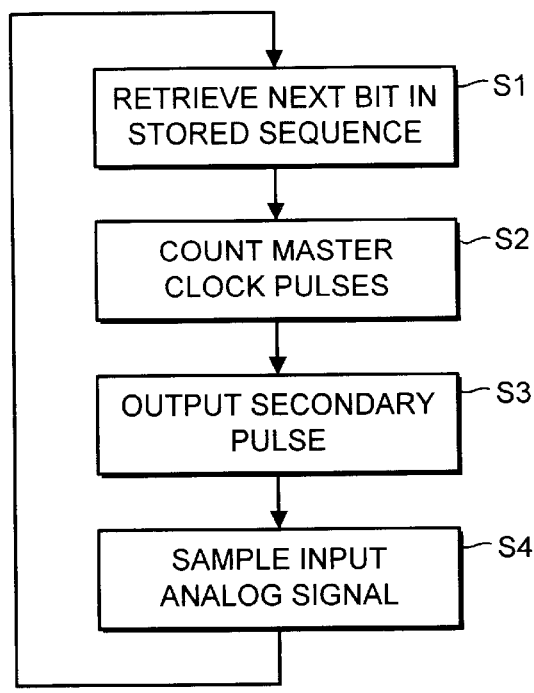
FIG. 3 is a flow chart illustrating a method carried out in accordance with the invention.

This cyclical process is further illustrated in FIG. 3, which is a flow chart showing the operation of the device. Thus, in step S1, the divider 10 retrieves a bit from the memory 12, which determines its division ratio for the time being. In step S2, the divider 10 monitors the input pulses and, in step S3, following receipt of the number of pulses indicated by the division ratio, it outputs a secondary pulse. This secondary pulse is used in step S4 to trigger the sampler 2 to take a sample of the analog signal and the process returns to the start as the secondary pulse also causes the next bit in the stored sequence to be retrieved from the memory 12.

Figure 4:
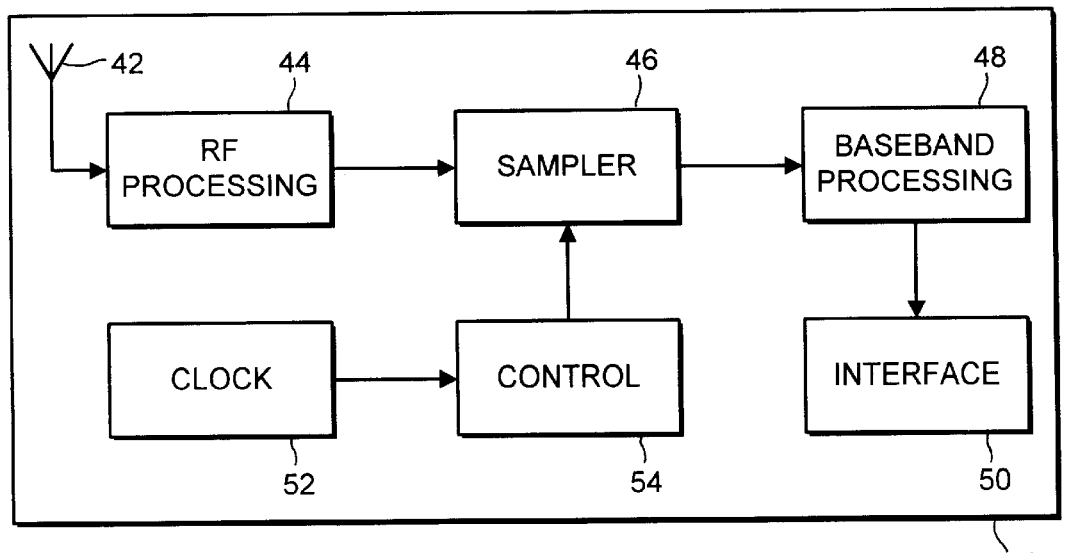
FIG. 4 is a block schematic diagram of a dual mode mobile phone in accordance with a further aspect of the invention.

FIG. 4 is a block schematic diagram of a dual mode cellular phone in accordance with an aspect of the invention. The phone is of generally conventional design, as well understood in the art, except where shown in FIG. 4 and described in more detail below.

The phone 40 is a dual mode phone which is operable in two modes which have different symbol rates, that is, different rates at which received signals must be sampled. As an example, the phone may be operable in AMPS (Advanced Mobile Phone System) and PCS (Phone Cellular System) modes.

The phone 40 includes an antenna 42, RF processing circuitry 44, sampler 46, baseband processing circuitry 48, and interface (loudspeaker, etc) 50. The sampler 46 operates on the basis of a clock signal generated by master clock circuitry 52, and control circuitry 54. In this exemplary embodiment, the master clock 52 operates at 13 MHz. In the PCS mode, the required sampling rate is 270.833 kHz, which is 1/48 of this master clock frequency. The control circuitry 54 can operate in an entirely conventional way to cause the sampler 46 to sample received input signals at the desired rate.

However, in the AMPS mode, the desired sampling rate is not a simple fraction of the master clock frequency, and hence the control circuitry 54 includes a divider 10 and memory 12 as shown in FIG. 1, which allow it to cause the sampler 46 to sample the received signals at the desired rate.

Thus, depending on the desired mode of operation, the control circuitry 54 switches between two sampling modes with different sampling rates.

The generation of the secondary clock pulses at a rate which jitters between two distinct sampling rates, each of which is an integer factor of a master clock frequency, produces the correct average sampling rate. However, jittering also introduces noise. The exact sequence stored in the memory 12 is crucial in determining the characteristics of this noise component. The sequence stored in the memory is pre-calculated off-line. For example, delta-sigma modulation might be used, but any other method which produces a sequence with a desirable spectral content can be used. For example, the length of the stored sequence can be as long as is required to give the desired spectral properties of the jitter, consistent with an acceptable requirement for memory usage.

In the example described above, the divider is able to select between two division ratios, which are adjacent integers. However, it will be appreciated that these division ratios need not be adjacent. Moreover, the divider may if desired be able to select between more than two division ratios. In this latter case, the memory must store not just a sequence of binary values, but a sequence of two-or-more-bit values. Any such variation or modification may be made, in order to achieve desirable results in the output signal.

It is an advantage of the invention that any available method may be used for calculating the stored sequence, because these calculations are carried out only once, off-line, and do not need to be performed in real time. Moreover, the memory 12 is advantageously reprogrammable, allowing the stored sequence to be replaced by an improved sequence at a later date.

There is thus described a sampling circuit which is easy to implement and has low power consumption, while providing desirable sampling properties.

What is claimed is:

1. A sampling circuit comprising means for sampling an analog signal at a plurality of points in time, each point being separated from the next by an integer number of cycles at a clock frequency, and the numbers of clock cycles separating successive pairs of sampling points forming a sequence, wherein the circuit further comprises means for storing the said sequence, which has been previously calculated.

2. A sampling circuit as claimed in claim 1, wherein the means for storing the said sequence is a reprogrammable memory.

3. A sampling circuit as claimed in claim 1, wherein the means for storing the said sequence stores a sequence of digital values, wherein the number of clock cycles between two successive sampling points of the analog signal is determined by a present value from the stored sequence, and wherein a next value from the stored sequence is output following each sampling point.

4. A sampling circuit as claimed in claim 3, wherein the digital values are single bits.

5. A sampling circuit as claimed in claim 3, wherein the number of clock cycles between two successive sampling points of the analog signal can be either a first integer or a second integer, depending on the present value from the stored sequence.

6. A sampling circuit as claimed in claim 5, wherein the first and second integers are consecutive.

7. A sampling circuit as claimed in claim 1, further comprising a clock generator for producing a signal at the clock frequency.

8. A sampling circuit as claimed in claim 1, wherein the stored sequence has been previously calculated using delta-sigma modulation.

9. A sampling circuit, comprising:

an input for an analog signal;

means for receiving a master clock signal;

a divider for dividing the clock signal frequency by an integer number to produce output secondary clock pulses, the integer number being chosen from a plurality of available integer numbers in response to a divider input signal;

means for sampling the input analog signal in response to the secondary clock pulses; and means for storing a predetermined sequence of signals for supply to the divider as divider input signals.

10. A sampling circuit as claimed in claim 9, wherein a next signal from the stored predetermined sequence of signals is supplied to the divider in response to each secondary clock pulse.

11. A sampling circuit as claimed in claim 9, wherein the available integer numbers are two consecutive integer numbers, and the predetermined sequence of signals comprises single-bit digital values.

12. A sampling circuit as claimed in claim 9, wherein the available integer numbers comprise more than two integer numbers, and the predetermined sequence of signals comprises multiple-bit digital values.

13. A sampling circuit as claimed in claim 9, wherein the divider outputs a secondary clock signal pulse, following receipt of the chosen integer number of master clock signal pulses, and the means for sampling the input analog signal takes a sample on receipt of the secondary clock signal pulse.

14. A method of sampling an analog signal at a rate which is a rational, non-integer fraction of a clock frequency, the method comprising sampling the analog signal at a plurality of points in time, each point being separated from the next by an integer number of cycles at the clock frequency, and the numbers of clock cycles separating successive pairs of sampling points forming a sequence, and the method further comprising calculating in advance, and storing, the said sequence.

15. A method as claimed in claim 14, comprising calculating the stored sequence using delta-sigma modulation.

16. A dual mode phone, comprising:

receiver circuitry for incoming analog signals;

a sampler for the incoming analog signals;

a clock signal generator for producing a clock signal having a clock frequency; and a control device, the control device being operable to control the operation of the sampler in first and second modes, wherein, in a first mode, the sampler samples the analog signal at a rate which is a rational, non-integer fraction of the clock frequency, the control device being operable to cause the sampler to sample the analog signal at a plurality of points in time, each point being separated from the next by an integer number of cycles at the clock frequency, and the numbers of cycles separating successive pairs of sampling points forming a sequence, the control device further including a memory for storing the said sequence.

17. A dual mode phone as claimed in claim 16, wherein, in a second mode, the sampler samples the analog signal at a rate which is an integer fraction of the clock frequency.

* * * * *